(12) United States Patent
Chen et al.

(10) Patent No.: US 6,482,738 B1
(45) Date of Patent: Nov. 19, 2002

(54) METHOD OF LOCALLY FORMING METAL SILICIDE LAYERS

(75) Inventors: Ying-Tso Chen, Kaohsiung (TW); Erh-Kun Lai, Taichung (TW); Hsin-Huei Chen, Miao-Li (TW); Shou-Wei Hwang, Chilung (TW); Yu-Ping Huang, Taichung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/996,821

(22) Filed: Nov. 30, 2001

(51) Int. Cl.$^7$ ................................................. H01L 21/44
(52) U.S. Cl. ...................... 438/656; 438/592; 438/588; 438/655
(58) Field of Search ................................. 438/656, 592, 438/655, 588, 229, 197, 663, 680

(56) References Cited

U.S. PATENT DOCUMENTS

| | | | | |
|---|---|---|---|---|
| 5,444,023 A | * | 8/1995 | Homma | 438/656 |
| 5,518,959 A | * | 5/1996 | Jang et al. | 438/627 |
| 5,527,738 A | * | 6/1996 | Koh et al. | 438/654 |
| 5,691,236 A | * | 11/1997 | Chu | 438/631 |
| 5,776,823 A | * | 7/1998 | Agnello et al. | 438/592 |
| 6,010,961 A | * | 1/2000 | Hu | 438/648 |
| 6,136,677 A | * | 10/2000 | Prein | 438/592 |
| 6,169,025 B1 | * | 1/2001 | Kuo | 438/621 |
| 6,171,954 B1 | * | 1/2001 | Hsu | 438/645 |
| 6,372,640 B1 | * | 4/2002 | Chen et al. | 438/656 |
| 6,383,903 B1 | * | 5/2002 | Lai et al. | 438/229 |
| 6,413,861 B1 | * | 7/2002 | Huang et al. | 438/663 |

\* cited by examiner

*Primary Examiner*—John F. Niebling
*Assistant Examiner*—Walter L. Lindsay, Jr.

(57) ABSTRACT

The present invention mainly provides a method to locally form metal silicide on an integral circuit and to avoid the phenomenon of leakage current which is caused by metal silicide formed between the memory cells on the same word line. The method of present invention achieve above objectives by principally using a design rule to adequately arrange elements in proper distance. In an embodiment, in order to form metal silicide layers on an integral circuit and to avoid metal silicide formed between two neighboring memory cell on the same word line, a dielectric layer is previously formed in the spaced region between the two neighboring memory cells and is used as a mask. Thus, in a following selective etching process, a part of silicon substrate within the above spaced region can be protected and not exposed. Therefore, no metal silicide is formed in the spaced region, and the above objectives is achieved.

17 Claims, 8 Drawing Sheets

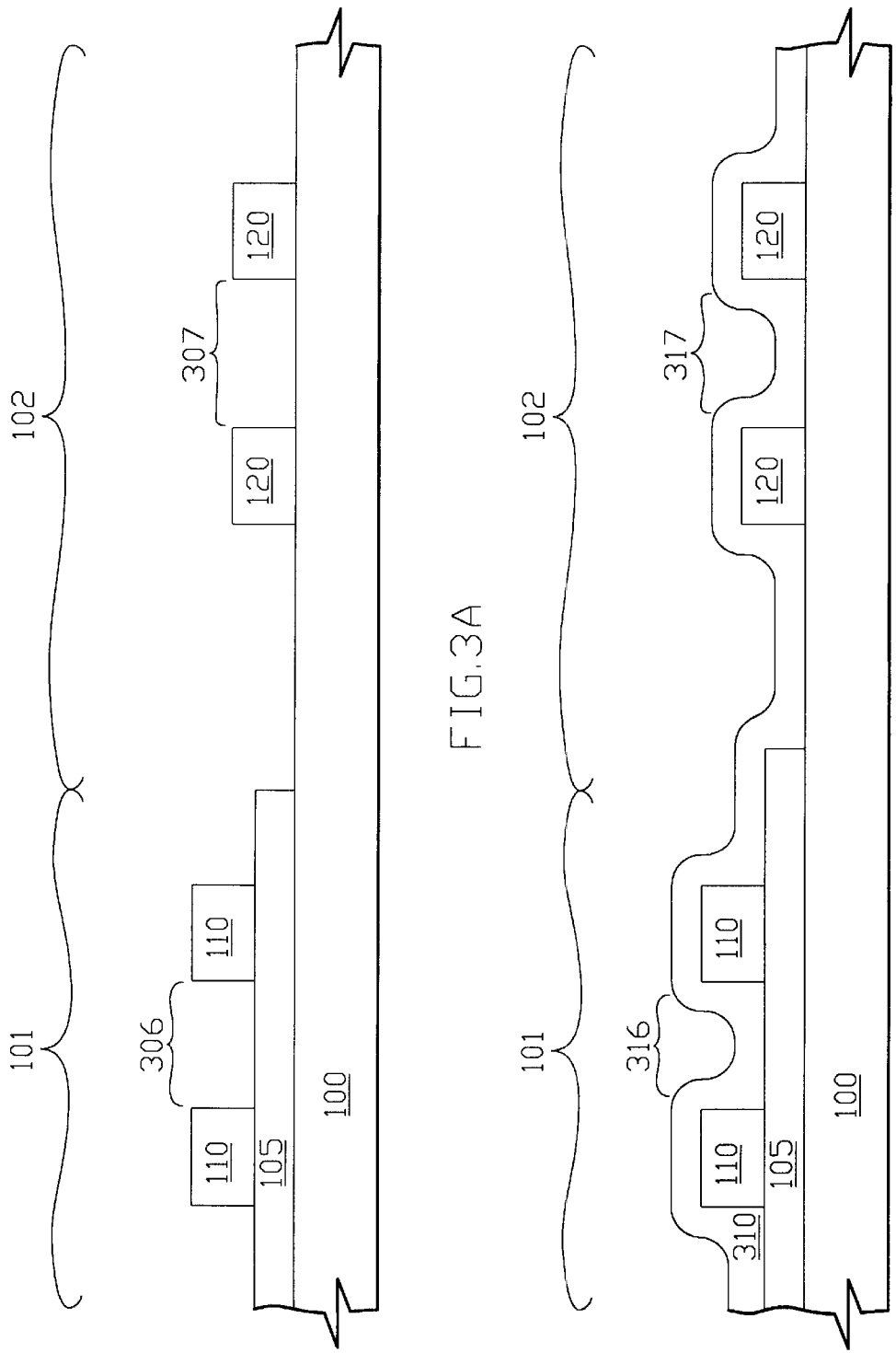

METHOD OF LOCALLY FORMING METAL SILICIDE LAYERS

BACKGROUND

1. Field of the Invention

The present invention generally relates to a method of locally forming metal silicide layers, and in particular to a method of locally forming metal silicide layers and avoiding a leakage current between memory cells caused by unwanted metal suicides.

2. Description of the Prior Art

In order to reduce the resistance and improve the performance of a integral circuit, a metal silicide layer, such as titanium silicide, is usually deposited on the surface of the circuit and elements. But in some regions where the resistance have to be kept high, such as the spaced region between two neighboring memory cells on the same word line, the metal silicide layer should be avoided. A conventional method is shown in FIG. 1: first, a silicon substrate 100 is provided. There are at least two regions on the substrate 100: one is an array region 101, the other is a periphery region 102. In the array region 101, a dielectric layer 105, such as an oxide-nitride-oxide (ONO) layer, is deposited on the substrate 100. A memory array with gates 100 and sidewalls 130 is formed on the dielectric layer 105, wherein a first spaced region 106 is existed between two neighboring memory cells on the same word line. In the periphery region 102, there are at least a plurality of gates 120 of transistors and the sidewalls 140 of the gates 120, wherein a second spaced region 107 is existed between two neighboring transistors. After a process of forming metal silicide, the metal silicide layers (150, 160, 170) are formed on the surface of the top of the gates 110 of memory cells, the surface of the top of the gates 120 of transistors, and the surface of silicon substrate 100.

However, in the prior method the process of forming the sidewall 130 of the gates 100 of the memory cells is hard to control, so an overetching phenomenon frequently occurs to expose a part of the substrate 100 within the first spaced region 206, as shown in FIG. 2A. Thus a metal silicide layer 240 is also formed on the surface of silicon substrate 100 within the first spaced region 206 when the process of forming metal silicide is carried out. As shown in FIG. 2B, the metal silicide layer 240 on the surface of silicon substrate 100 within the first spaced region 206 will cause the leakage current, and degrade the performance of the memory cells.

SUMMARY

It is an object of the invention to provide a method of locally forming metal silicide layers on a integral circuit.

It is another object of the invention to provide a method to avoid a leakage current caused by the formation of metal silicide layers between memory cells on the same word line.

According to the foregoing objects, the present invention provides a method comprising the following steps: first, a silicon substrate is provided. The silicon substrate can be divided into at least two regions: one is the array region, the other is the periphery region. In the array region, an ONO layer is deposited on the substrate, and a plurality of first transistors, such as a memory array, is formed on the ONO layer. A first spaced region is existed between any two neighboring transistors of the plurality of the first transistors. In the periphery region, a plurality of second transistors are formed on the substrate, and a second spaced region is existed between any two neighboring transistors of the plurality of the second transistors. The second spaced region is larger than the first spaced region. Afterward, a first dielectric layer is conformally deposited to cover the surface of the substrate, the array region, the plurality of the first transistors, the periphery region, and the plurality of the second transistors. Then, an second dielectric layer is deposited on the first dielectric layer, wherein the thickness of those second dielectric layer within the first spaced region is larger than that of the second dielectric layer in any other region. A selective etching process is then performed to remove a partial second dielectric layer so that a part of first dielectric layer on the plurality of the first transistors is exposed. A part of the remaining second dielectric layer is within the first spaced region. A photoresist layer is then formed to cover the remaining second dielectric layer and the first dielectric layer. The part of the photoresist layer within the periphery region is then removed. By using the remaining photoresist layer as a mask, another etching process is performed to completely remove those second dielectric layer within the periphery region. Afterward, the remaining photoresist layer is also removed. Then, another selective etching process is performed to remove a partial first dielectric layer to form the sidewalls of the plurality of first transistors and the plurality of second transistors. At the same time, the top surface of the gates of the plurality of the first transistors and the plurality of the second transistors is exposed, and a part of the substrate within the periphery region is also exposed. Most of the first dielectric layer within the first spaced region remains, because a part of the second dielectric layer is existed within the first spaced region of array region. Afterward, a metal layer is deposited to cover the silicon substrate, the array region and the periphery region. A heating process is then executed to form metal silicide. Finally, the metal layer is removed.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein:

FIG. 3A to FIG. 3K show a series of schematic cross-sectional diagrams of an embodiment according to the present method of locally forming metal silicide layers on an integral circuit.

DESCRIPTION OF THE PREFERRED EMBODIMENT

Figure 1:
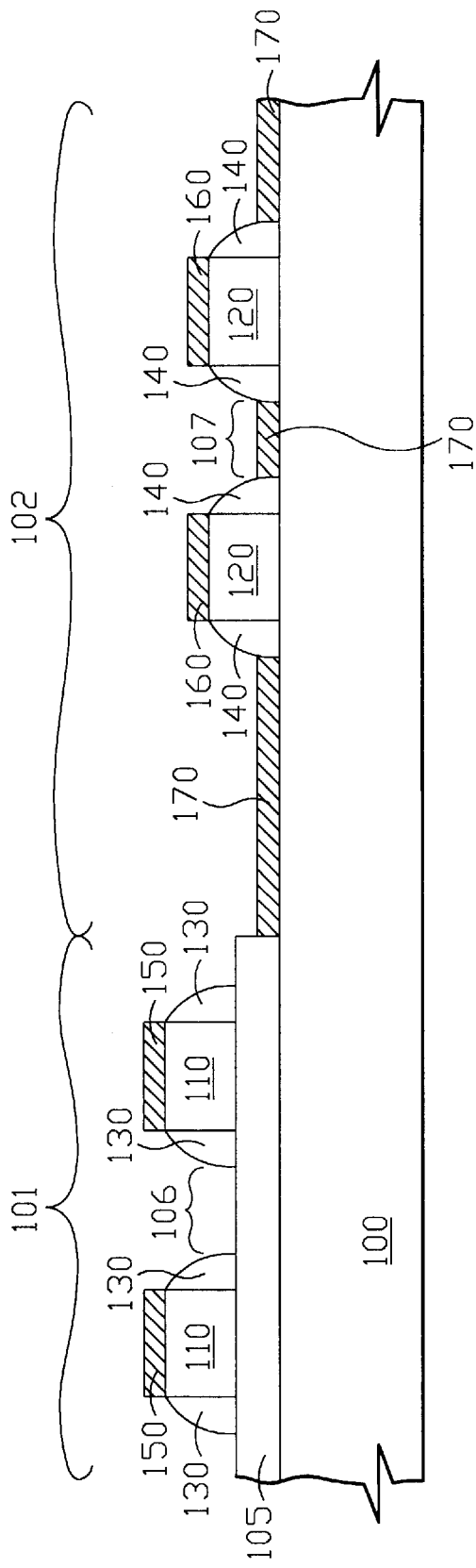
FIG. 1 shows a schematic cross-sectional diagram of a conventional method of locally forming metal silicide layer on a integral circuit.
Figure 2A:
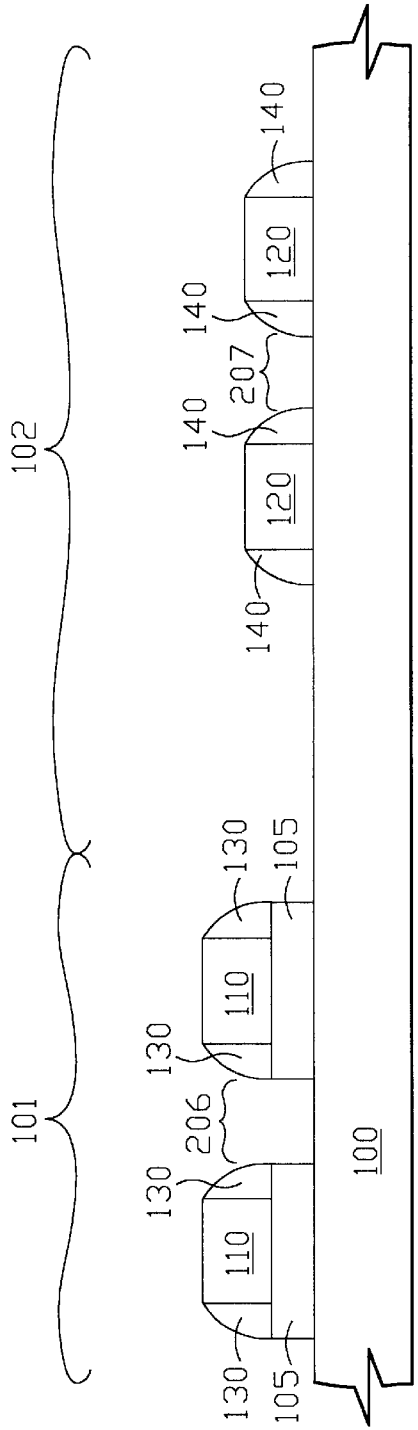
FIG. 2A to FIG. 2B show a series of schematic cross-sectional diagrams of an embodiment according to the conventional method in which an overetching phenomenon occurs.
Figure 2B:
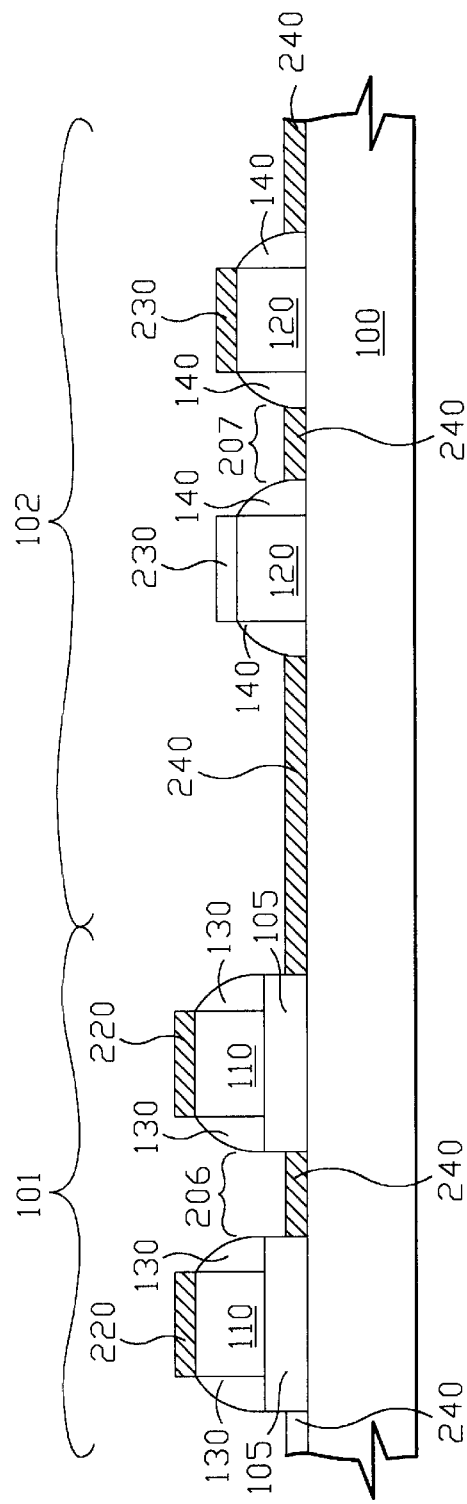

In present invention we provide a method of locally forming metal silicide layers on a integral circuit, wherein the method comprises the following steps: first, as shown in FIG. 3A, a substrate 100 is provided, and there are at least two regions on the substrate 100: one is the array region 101, the other is the periphery region 102. In the array region, an ONO layer is deposited on the substrate 100, and a memory array is formed on the ONO layer 105. The gates 110 of the memory cell are two neighboring gates on the same word line, and a first spaced region 306 is existed between them.

In the periphery region 102, there is at least a plurality of gates 120 of transistors, and a second spaced region 307 is existed between two neighboring gates 120 of transistors. The width of the second spaced region 307 is larger than that of the first spaced region 306. In this embodiment, the width of the gates 110 of the memory cells is about 0.38 angstrom, and the width of the first spaced region 306 between two neighboring gates 110 of memory cells is about 0.32 angstrom. The width of the gates 120 of the transistors is about 0.24 angstrom, and the width of the second spaced region 307 between two neighboring gates 110 of transistors is about 0.36 angstrom. The thickness of the gates 110 of the memory cells and the gates 120 of the transistors is about 0.25 angstrom.

Afterward, as shown in FIG. 3B, a first dielectric layer is conformally deposited to cover the surface of the array region 101, the gates 110 of memory cells, the periphery region 102, and the gates 120 of transistors. The thickness of the first dielectric layer is about 0.08 angstrom. The material of first dielectric layer is comprised silicone oxide layer or silicon nitride layer. In this embodiment, the silicone oxide layer is preferred to form first dielectric layer. Thus, a first trench 316 is formed within the first spaced region 306, and the width of the first trench 316 is about 0.16 angstrom. Similarly, a second trench 317 is formed within the second spaced region 307, and the width of the second 317 trench is about 0.20 angstrom.

Figure 3C:
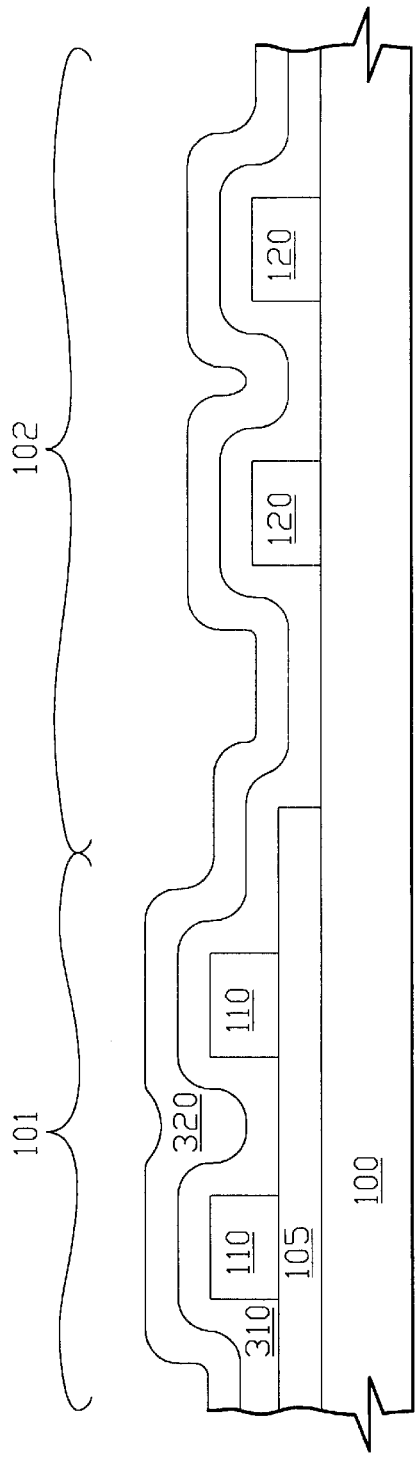

Then, a second dielectric layer 320 is conformally deposited on the surface of the first dielectric layer 310, as shown in FIG. 3C. The material of second dielectric layer is comprised silicon nitride layer or silicon oxide layer. In this embodiment, the silicon nitride layer is preferred to form second dielectric layer. The first dielectric layer and second dielectric layer are changeable, only the etch selectivity is difference. It should be noted that the thickness of those second dielectric layer deposited within the first trench 316 is larger than that of second dielectric layer deposited in any other place, because the first trench 316 is more narrow so that the rate of depositing is more larger. But the second dielectric layer within the second trench 317 doesn't have such phenomenon, because the width of the second trench 317 is wider. The present design rule is just the difference between this invention and the prior art.

Figure 3D:
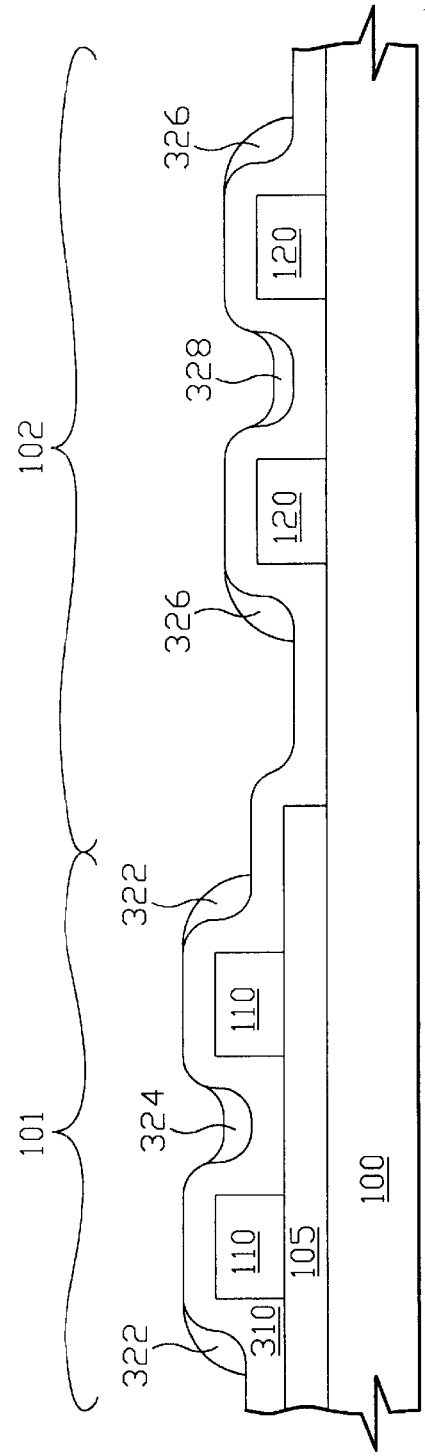

Afterward, as shown in FIG. 3D, a selective etching process is performed to remove a partial second dielectric layer 320, so that a partial first dielectric layer 310 is exposed, and the remaining nitride is usually in corners or within trenches, such as the first sidewall 322, the second sidewall 326, the second dielectric layer 324 in the first trench 316, and the second dielectric layer 328 in the second trench 317. The etching reagent is with a larger etching rate to nitride than oxide. It should mentioned that the etching process is controlled to make the second dielectric layer 324 within the first trench 316 remain, but the remaining of the first sidewall 322, the second sidewall 326, and the second dielectric layer 328 within the second trench 328 is not necessary.

Figure 3E:
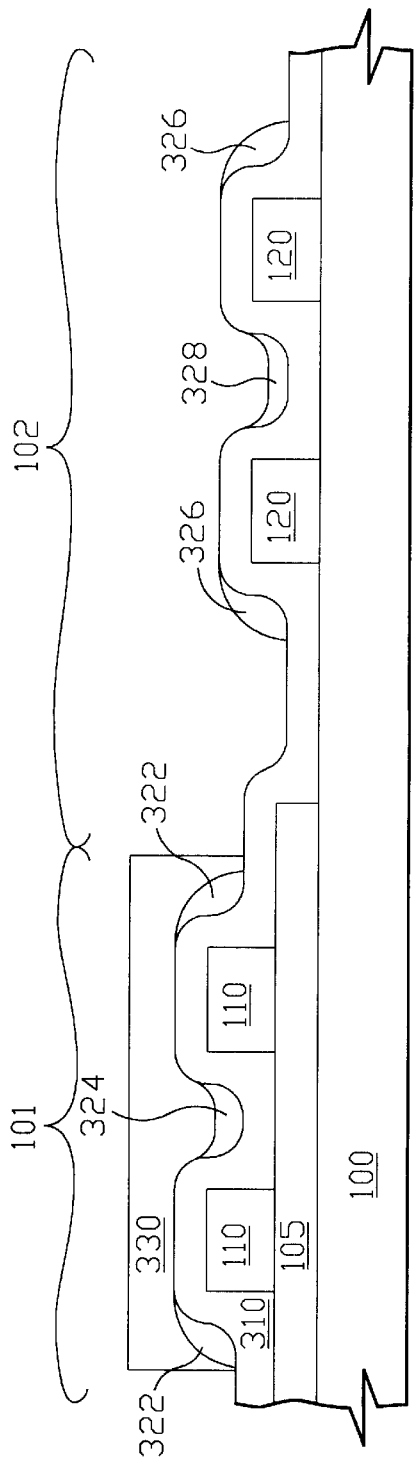
Figure 3F:
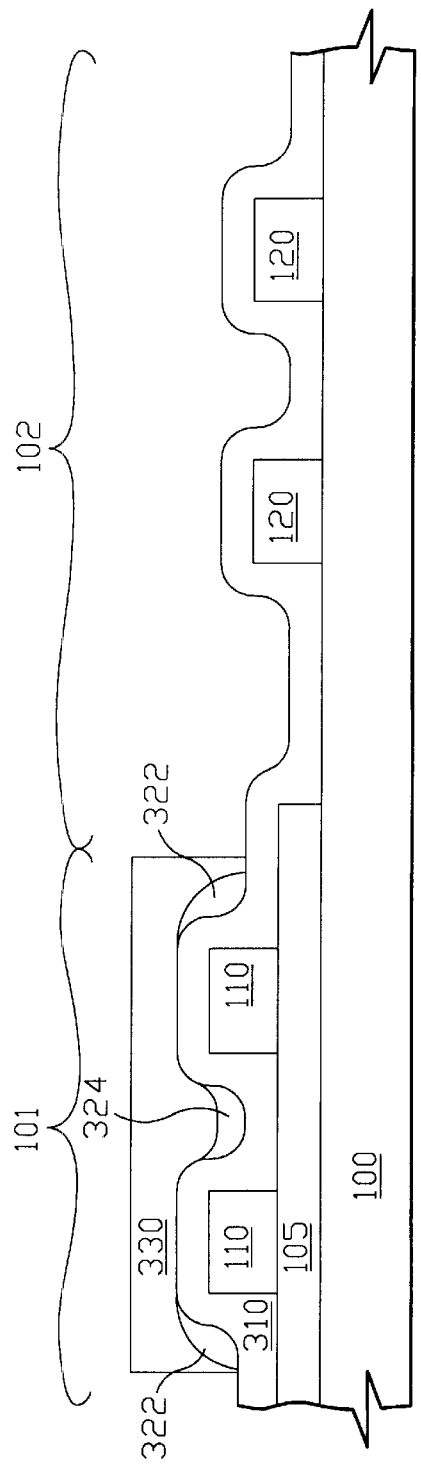
Figure 3G:
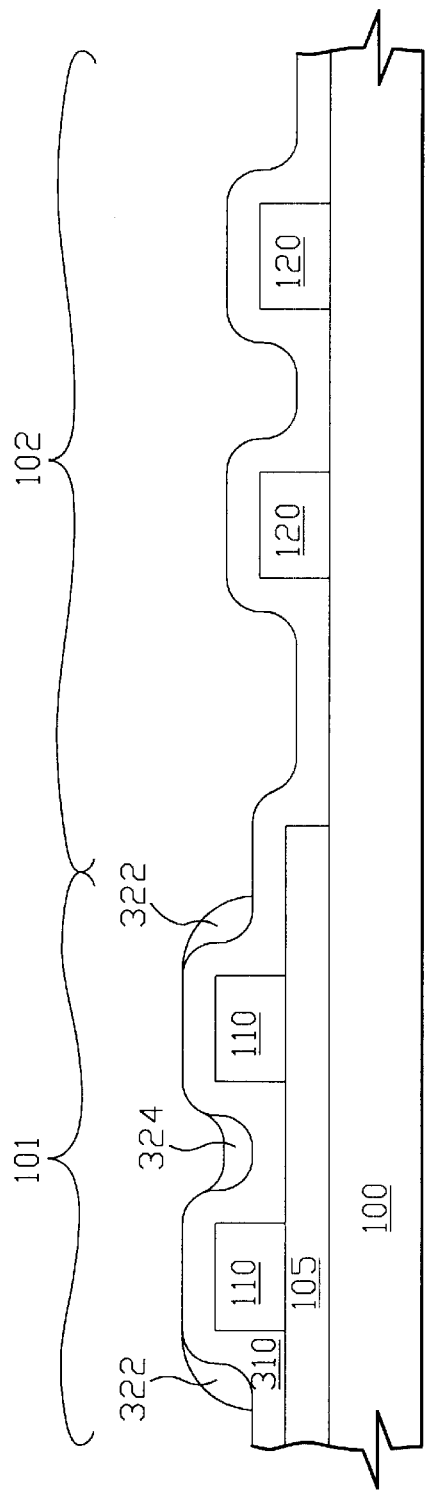

Then, a photoresist layer 330 is deposited to cover the first dielectric layer 310 and the remaining second dielectric layer. The photoresist layer is then patterned and etched, so that a part of the photoresist layer in the periphery region is removed, as shown in FIG. 3E. Afterward, another selective etching process is performed to completely remove the second dielectric layer which is remaining in the periphery region 102, such as the second sidewall 326 and the second dielectric layer 328 within the second trench 317, as shown in FIG. 3F. Then, the photoresist layer 330 is removed, as shown in FIG. 3G.

Figure 3H:
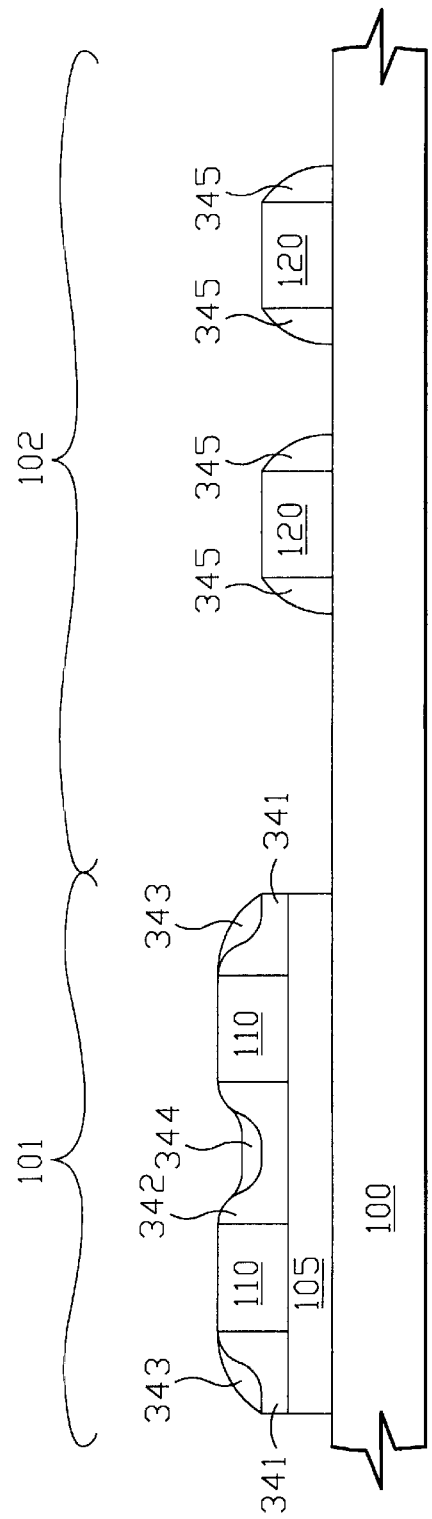

Afterward, a selective etching process is performed to remove a partial nitride second dielectric layer 310 to expose the top surface of the gates 110 of the memory cells, the gates 120 of the transistors, and a part of the substrate 100. At the same time, the sidewall of the gates 110 of the memory cell and the sidewall 345 of the gates 120 of the transistors are formed, as shown in FIG. 3H. The conditions of this selective etching process is different from the above. The etching reagent in this etching process is with a greater etching rate to nitride than nitride, so the second dielectric layer within the array region 101 is shielded by the remaining second dielectric layer (322, 324) and most of them will remain. As shown in FIG. 3H, the sidewalls of the gates 110 of the memory cells consist of the second dielectric layer 343 and the second dielectric layer 341. In the first trench 316, the second dielectric layer 344 and the second dielectric layer 342 are remained. Therefore, the surface of the silicon substrate within the first spaced region 306 will not be exposed after the etching process is carrier out.

Figure 3I:
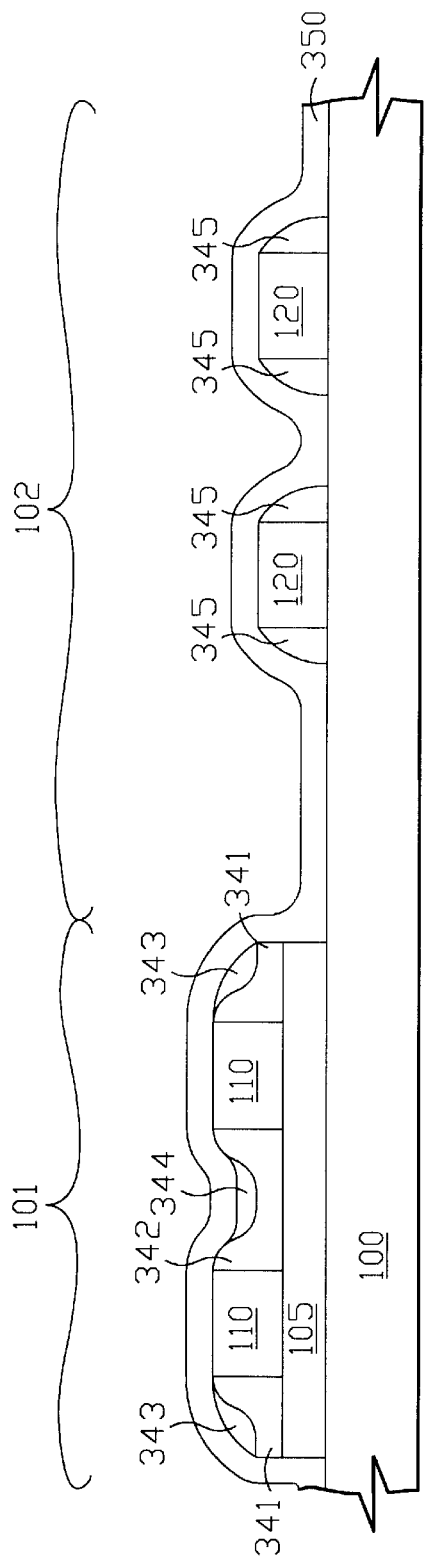
Figure 3J:
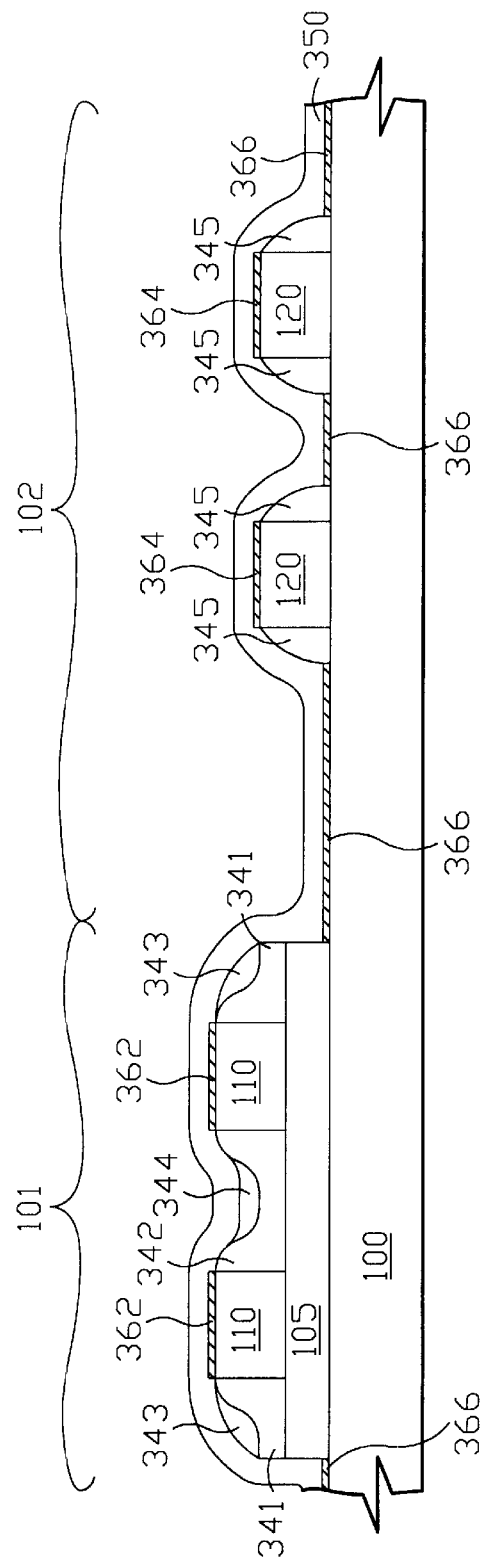
Figure 3K:
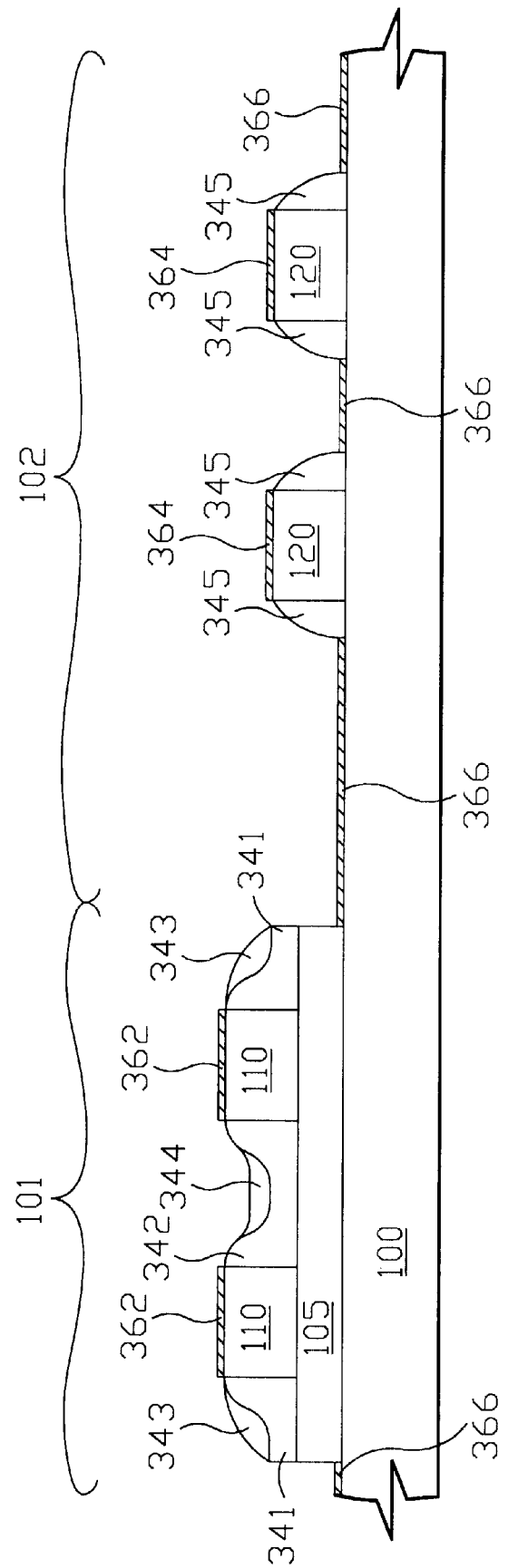

Afterward, a metal layer 350, such as titanium, is deposited to cover the overall integral circuit, as shown in FIG. 3I. A heating process is then performed to make the metal react with the polysilicon to form metal silicide (362, 364, 366), as shown in FIG. 3J. Finally, the metal layer 350 is removed, as shown in FIG. 3K. Therefore, the method of locally forming metal silicide is completed.

In addition, the ONO layer 105 in the array region 101 can be replaced by other kind of dielectric layer. An second dielectric layer is further comprised between the gate 120 of transistor and the silicon substrate 100 and is used as a gate first dielectric layer.

Although specific embodiments have been illustrated and described, it will be obvious to those skilled in the art that various modifications may be made without departing from what is intended to be limited solely by the appended claims.

What is claimed is:

1. A method of locally forming metal silicide layers, said method comprising the steps of:

providing a silicon substrate, and said silicon substrate is divided into at least two regions: one is an array region, the other is a periphery region;

forming a first dielectric layer on said silicon substrate in said array region and a plurality of first transistors on said first dielectric layer, wherein there is a first spaced region between any two neighboring gates of said plurality of first transistors;

forming a plurality of second transistors on said silicon substrate in said periphery region, wherein there is a second spaced region between any two neighboring gates of said plurality of second transistors, and said second spaced region is larger than said first spaced region;

conformally depositing a second dielectric layer to cover said silicon substrate, said array region, and said periphery region;

depositing a third dielectric layer on said second dielectric layer, wherein the thickness of those third dielectric layer within said first spaced region is larger than that of third dielectric layer in any other region;

performing a first selective etching process to remove a partial said third dielectric layer, so that a part of said second dielectric layer on said gates of said plurality of first transistors is exposed, wherein a part of the remaining said third dielectric layer is within said first spaced region;

depositing a photoresist layer to cover said third dielectric layer and said second dielectric layer;

removing a part of said photoresist layer within said periphery region;

performing a second selective etching process to completely remove said remaining third dielectric layer within said periphery region by using said photoresist layer as a mask;

removing said photoresist layer;

performing a third selective etching process to remove a part of said second dielectric layer to expose a partial surface of said silicon substrate within said periphery region and to expose the top surface of each gate of said plurality of first transistors and said plurality of second transistors, so a sidewall of each gate of said plurality of first transistors and said plurality of second transistors is formed, wherein a part of said third dielectric layer in said first spaced region is used as a mask, therefore, a part of said second dielectric layer within said first spaced region remains;

depositing a metal layer to cover said silicon substrate, said array region, and said periphery region;

performing a heating process to form metal silicide; and removing said metal layer.

2. The method according to claim 1, wherein said first dielectric layer is an oxide-nitride-first dielectric layer.

3. The method according to claim 1, wherein said second dielectric layer is silicon oxide layer.

4. The method according to claim 1, wherein said third dielectric layer is silicon nitride layer.

5. The method according to claim 1, said method further comprising a gate oxide between said silicon substrate and said gates of said plurality of second transistors.

6. The method according to claim 1, wherein the etching reagent of said first selective etching process is with a larger etching rate to third dielectric layer than second dielectric layer.

7. The method according to claim 1, wherein the etching reagent of said second selective etching process is with a larger etching rate to third dielectric layer than second dielectric layer.

8. The method according to claim 1, wherein the etching reagent of said third selective etching process is with a larger etching rate to second dielectric layer than third dielectric layer.

9. The method according to claim 1, wherein said metal layer is a titanium layer.

10. A method of locally forming metal silicide layers, said method comprising the steps of:

providing a silicon substrate, and said silicon substrate is divided into at least two regions: one is an array region, the other is a periphery region;

forming a first dielectric layer on said silicon substrate in said array region and a plurality of first transistors on said silicon oxide layer, wherein there is a first spaced region between any two neighboring gates of said plurality of first transistors;

forming a plurality of second transistors on said silicon substrate in said periphery region, wherein there is a second spaced region between any two neighboring gates of said plurality of second transistors, and said second spaced region is larger than said first spaced region;

conformally depositing a silicon oxide layer to cover said silicon substrate, said array region, and said periphery region;

depositing a silicon nitride layer on said silicon oxide layer, wherein the thickness of those silicon nitride layer within said first spaced region is larger than that of silicon nitride layer in any other region;

performing a first selective etching process to remove a partial said silicon nitride layer, so that a part of said silicon oxide layer on said gates of said plurality of first transistors is exposed, wherein a part of the remaining silicon nitride layer is within said first spaced region and the etching reagent of said first selective etching process is with a larger etching rate to silicon nitride layer than silicon oxide layer;

depositing a photoresist layer to cover said silicon nitride layer and said silicon oxide layer;

removing a part of said photoresist layer within said periphery region;

performing a second selective etching process to completely remove said remaining silicon nitride layer within said periphery region by using said photoresist layer as a mask, wherein the etching reagent of said second selective etching process is with a larger etching rate to silicon nitride layer than silicon oxide layer;

removing said photoresist layer;

performing a third selective etching process to remove a part of said silicon oxide layer to expose a partial surface of said silicon substrate within said periphery region and to expose the top surface of each gate of said plurality of first transistors and said plurality of second transistors, so a sidewall of each gate of said plurality of first transistors and said plurality of second transistors is formed, wherein the etching reagent of said third selective etching process is with a larger etching rate to silicon oxide layer than silicon nitride layer, and a part of said silicon nitride layer in said first spaced region is used as a mask, therefore, a part of said silicon oxide layer within said first spaced region remains;

depositing a metal layer to cover said silicon substrate, said array region, and said periphery region;

performing a heating process to form metal silicide; and removing said metal layer.

11. The method according to claim 10, wherein said first dielectric layer is an oxide-nitride-first dielectric layer.

12. The method according to claim 10, said method further comprising a gate oxide between said silicon substrate and said gates of said plurality of second transistors.

13. The method according to claim 10, wherein said metal layer is a titanium layer.

14. A method of locally forming metal silicide layers, said method comprising the steps of:

providing a silicon substrate, and said silicon substrate is divided into at least two regions: one is an array region, the other is a periphery region;

forming a first dielectric layer on said silicon substrate in said array region and a plurality of first transistors on said silicon oxide layer, wherein there is a first spaced region between any two neighboring gates of said plurality of first transistors;

forming a plurality of second transistors on said silicon substrate in said periphery region, wherein there is a second spaced region between any two neighboring gates of said plurality of second transistors, and said second spaced region is larger than said first spaced region;

conformally depositing a silicon nitride layer to cover said silicon substrate, said array region, and said periphery region;

depositing a silicon oxide layer on said silicon nitride layer, wherein the thickness of those silicon oxide layer within said first spaced region is larger than that of silicon oxide layer in any other region;

performing a first selective etching process to remove a partial said silicon oxide layer, so that a part of said silicon nitride layer on said gates of said plurality of first transistors is exposed, wherein a part of the remaining silicon oxide layer is within said first spaced region and the etching reagent of said first selective etching process is with a larger etching rate to silicon oxide layer than silicon nitride layer;

depositing a photoresist layer to cover said silicon oxide layer and said silicon nitride layer;

removing a part of said photoresist layer within said periphery region;

performing a second selective etching process to completely remove said remaining silicon oxide layer within said periphery region by using said photoresist layer as a mask, wherein the etching reagent of said second selective etching process is with a larger etching rate to silicon oxide layer than silicon nitride layer;

removing said photoresist layer;

performing a third selective etching process to remove a part of said silicon nitride layer to expose a partial surface of said silicon substrate within said periphery region and to expose the top surface of each gate of said plurality of first transistors and said plurality of second transistors, so a sidewall of each gate of said plurality of first transistors and said plurality of second transistors is formed, wherein the etching reagent of said third selective etching process is with a larger etching rate to silicon nitride layer than silicon oxide layer, and a part of said silicon oxide layer in said first spaced region is used as a mask, therefore, a part of said silicon nitride layer within said first spaced region remains;

depositing a metal layer to cover said silicon substrate, said array region, and said periphery region;

performing a heating process to form metal silicide; and removing said metal layer.

15. The method according to claim 14, wherein said first dielectric layer is an oxide-nitride-first dielectric layer.

16. The method according to claim 14, said method further comprising a gate oxide between said silicon substrate and said gates of said plurality of second transistors.

17. The method according to claim 14, wherein said metal layer is a titanium layer.

* * * * *